(12) United States Patent
Nakamura et al.

(10) Patent No.: US 8,686,637 B2
(45) Date of Patent: Apr. 1, 2014

(54) ORGANIC EL DEVICE (75) Inventors: Masahiro Nakamura, Eindhoven (NL);
Masahito Yamana, Hyogo (JP);
Takeyuki Yamaki, Nara (JP); Daiki Kato, Osaka (JP); Takahiro Koyanagi, Fukuoka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/812,571

(22) PCT Filed: Dec. 16, 2011

(86) PCT No.: PCT/JP2011/079198
§ 371 (c)(1),
(2), (4) Date: Jan. 28, 2013

(87) PCT Pub. No.: WO2012/114615
PCT Pub. Date: Aug. 30, 2012

(65) Prior Publication Data
US 2013/0119368 A1 May 16, 2013

(30) Foreign Application Priority Data

Feb. 21, 2011 (JP) ................................. 2011-035220

(51) Int. Cl.
*H01J 11/40* (2012.01)

(52) U.S. Cl.
USPC ........................................................ 313/587

(58) Field of Classification Search
None
See application file for complete search history.

(56) References Cited

U.S. PATENT DOCUMENTS

2011/0007042 A1   1/2011   Miyaguchi

FOREIGN PATENT DOCUMENTS

| JP | 07-130472 | 5/1995 |
| JP | 09-129369 | 5/1997 |
| JP | 2007-280693 | 10/2007 |
| JP | 2010-165620 | 7/2010 |

OTHER PUBLICATIONS

U.S. Appl. No. 13/812,569 to Masahiro Nakamura et al., filed Jan. 28, 2013.
U.S. Appl. No. 13/812,659 to Masahiro Nakamura et al., filed Jan. 28, 2013.
International Search Report (ISR) in International Application No. PCT/JP2011/079198, dated Feb. 7, 2012.

*Primary Examiner* — Steven Loke
*Assistant Examiner* — Mouloucoulaye Inoussa
(74) *Attorney, Agent, or Firm* — Greenblum & Bernstein, P.L.C.

(57) ABSTRACT

An organic EL device includes a first substrate having electrical conductivity, an organic layer formed on the first substrate, an electrode layer formed on the organic layer, and a second substrate joined to the electrode layer by an adhesive layer. In a region of a peripheral portion of the first substrate, the organic layer is not formed, and a portion of the electrode layer is provided on the first substrate through an insulating layer so as to extend to an outer peripheral side of a region where the organic layer is present. The extended electrode layer is folded back together with the insulating layer to a side opposite to the second substrate, to constitute an electrode taking-out portion.

10 Claims, 5 Drawing Sheets

<(A) LINE OR (D) LINE CROSS-SECTION>

(a)

<(B) LINE CROSS-SECTION>

(b)

<(C) LINE CROSS-SECTION>

ORGANIC EL DEVICE

TECHNICAL FIELD

The present invention relates to an organic EL device in which an electrode taking-out portion is formed.

BACKGROUND ART

In an electroluminescence (EL) element, a light emitting layer is formed on a transparent substrate so as to be interposed between an anode and a cathode. When a voltage is applied between the electrodes, light is emitted by exciters generated by recombination of holes and electrons injected as carriers to the light emitting layer. EL elements are generally classified into organic EL elements in which an organic substance is used as a fluorescent substance of a light emitting layer, and inorganic EL elements in which an inorganic substance is used as a fluorescent substance of a light emitting layer. In particular, organic EL elements are capable of emitting light of high luminance with a low voltage, and various colors of emitted light are obtained therefrom depending on the types of fluorescent substances. In addition, it is easy to manufacture organic EL elements as planar light emitting panels, and thus organic EL elements are used as various display devices and backlights. Furthermore, in recent years, organic EL elements designed for high luminance have been realized, and attention has been paid to use of these organic EL elements for lighting apparatuses.

A general organic EL element has a configuration in which a transparent electrode such as ITO is formed as an anode on a glass substrate, an organic layer including a light emitting layer composed of an organic light emitting material or the like is formed on the anode, and a metallic thin film layer such as aluminum is formed as a cathode on the organic layer. The anode is present between the substrate and the organic layer, and thus, in order to connect the anode to an external power supply terminal, a portion of the anode or a portion of an auxiliary electrode which assists in the electrical conductivity of the anode is provided so as to extend to the outside of a region where the organic layer is formed, and the extended portion serves as an electrode taking-out portion. In addition, the anode, the organic layer, and the cathode excluding the electrode taking-out portion of the anode and a portion of the cathode are sealed by a sealing member such as copper foil. According to this configuration, light generated by the light emitting layer when a voltage is applied between the anode and the cathode passes through the anode and the glass substrate directly or after being reflected by the cathode, and then is taken out from the element.

Unlike a general LED (inorganic EL element) in which a light emitting layer is crystalized, an organic layer of an organic EL element which includes a light emitting layer is composed of an organic material such as a polymer and thus can have flexibility. In addition, among such organic materials, there are some materials from which a light emitting layer can be formed by spin coating, ink jet printing, screen printing, or the like in addition to vacuum deposition. Furthermore, the substrate is not limited to the above-described glass substrate, and a translucent plastic substrate having flexibility can also be used as the substrate. When these materials are used, the organic EL element can be used as a light source of a flexible light-emitting device which can be wound or folded. In addition, there is known a method for manufacturing an organic EL device by a so-called roll-to-roll process in which a flexible substrate which is wound in a roll shape is fed to a film-forming apparatus for forming a light emitting layer and the like, and a device is wound in a roll shape and collected after film formation (e.g., see Japanese Laid-Open Patent Publication No. 2010-165620.)

DISCLOSURE OF THE INVENTION

However, Japanese Laid-Open Patent Publication No. 2010-165620 does not specifically describe how to form an electrode taking-out portion. In general, in order to provide an electrode taking-out portion, an anode and a light emitting layer need to be formed by patterning in complicated shapes, and thus a device cannot be necessarily efficiently manufactured even by the above-described manufacturing method by the roll-to-roll process.

The present invention has been made in view of the above problem, and an object of the present invention is to provide an organic EL device which allows an electrode taking-out portion to easily be formed therein and can be efficiently manufactured.

In order to solve the above problem, an organic EL device according to the present invention includes: a first substrate having electrical conductivity; an organic layer formed on the first substrate; an electrode layer formed on the organic layer; and a second substrate joined to the electrode layer by an adhesive layer. In a region of a peripheral portion of the first substrate, the organic layer is not formed, and a portion of the electrode layer is provided on the first substrate through an insulating layer so as to extend to an outer peripheral side of a region where the organic layer is present. The extended electrode layer is folded back together with the insulating layer to a side opposite to the second substrate, to constitute an electrode taking-out portion.

In the above organic EL device, the electrode layer in the electrode taking-out portion is preferably formed so as to be located inward of the insulating layer such that an end portion of the electrode layer is not short-circuited with the first substrate.

In the above organic EL device, a moisture absorbent layer is preferably provided on a surface of the second substrate which surface faces the electrode layer, such that the moisture absorbent layer does not overlap the region where the organic layer is formed and is not in contact with the electrode layer.

In the above organic EL device, the electrode taking-out portion excluding a portion of the electrode layer is preferably sealed by a sealing member.

In the above organic EL device, a portion of the sealing member is preferably an extended portion of the adhesive layer.

In the above organic EL device, the sealing member is preferably a member separate from the adhesive layer.

In the above organic EL device, the electrode layer preferably includes a main electrode portion which is in contact with the organic layer and an auxiliary electrode portion which is in contact with the main electrode portion and is insulated from the organic layer.

In the above organic EL device, the electrode layer in the electrode taking-out portion is preferably a portion of the auxiliary electrode portion.

In the above organic EL device, the main electrode portion is preferably composed of a grid electrode in which low-resistance thin wires are arranged in a lattice manner, in a stripe manner, or in a honeycomb manner.

In the above organic EL device, the first substrate is preferably composed of a metal material having barrier properties.

According to the present invention, the portion of the electrode layer is provided so as to extend in the region of the first substrate where the organic layer is not formed, and this portion is folded back to constitute the electrode taking-out portion. Therefore, the electrode taking-out portion can be formed by a simple procedure of folding back the first substrate, and the organic EL device can be efficiently manufactured.

DESCRIPTION OF THE PREFERRED EMBODIMENTS

Figure 1:
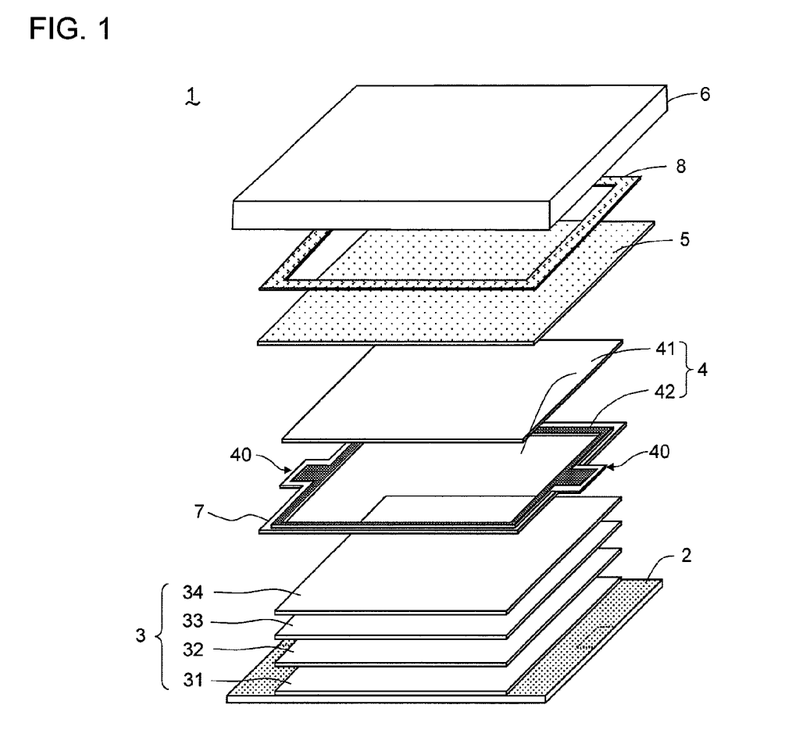
FIG. 1 is an exploded perspective view of an organic EL device according to an embodiment of the present invention.

The configuration of an organic EL device according to an embodiment of the present invention will be described with reference to FIGS. 1 to 5. As shown in FIG. 1, the organic EL device 1 according to the present embodiment includes a first substrate 2 having electrical conductivity, an organic layer 3 formed on the first substrate 2, an electrode layer 4 formed on the organic layer 3, and a second substrate 6 joined to the electrode layer 4 by an adhesive layer 5. In the present embodiment, the first substrate 2 serves not only as a substrate for forming the organic layer 3 but also as a cathode for supplying electrons. In addition, the electrode layer 4 serves as an anode for supplying positive holes to the organic layer 3.

The organic layer 3 includes an electron injection layer 31, a light emitting layer 32, a hole transport layer 33, and a hole injection layer 34 in order from the first substrate 2 side. On a surface of the second substrate 6 which surface faces the electrode layer 4, a moisture absorbent layer 8 is provided such that the moisture absorbent layer 8 does not overlap a region where the organic layer 3 is formed and is not in contact with the electrode layer 4. The electrode layer 4 includes a main electrode portion 41 which is in contact with the organic layer 3 and an auxiliary electrode portion 42 which is in contact with the main electrode portion 41 and is insulated from the organic layer 3 by an insulating layer 7.

At any of sides of a peripheral portion of the first substrate 2, the organic layer 3 is not formed. In the present embodiment, the organic layer 3 is not formed in portions indicated by a (B) line and a (C) line in FIG. 2. The region where the organic layer 3 is not formed suffices to be provided at any of the four sides of the first substrate 2, may not be provided over the overall length of one side, and may be provided partially at one side (not shown). Meanwhile, in regions at the outer peripheral sides of portions indicated by an (A) line and a (D) line in FIG. 2, the organic layer 3 is formed to the end portions (also see FIG. 3(a)). It is noted that in a process of manufacturing the organic EL device 1 according to the present embodiment, in the case where the organic layer 3 is formed on the first substrate 2 by a roll-to-roll process, a roll moving direction is set as an (A) line or (D) line direction in FIG. 2. At both sides including the portions indicated by the (A) line and the (D) line in FIG. 2, a retaining member (not shown) is provided for sealing the organic layer 3 and the like and protecting the side portion of the organic EL device 1. The retaining member may be provided also at both sides including the portions indicated by the (B) line and the (C) line in FIG. 2.

Figure 2:
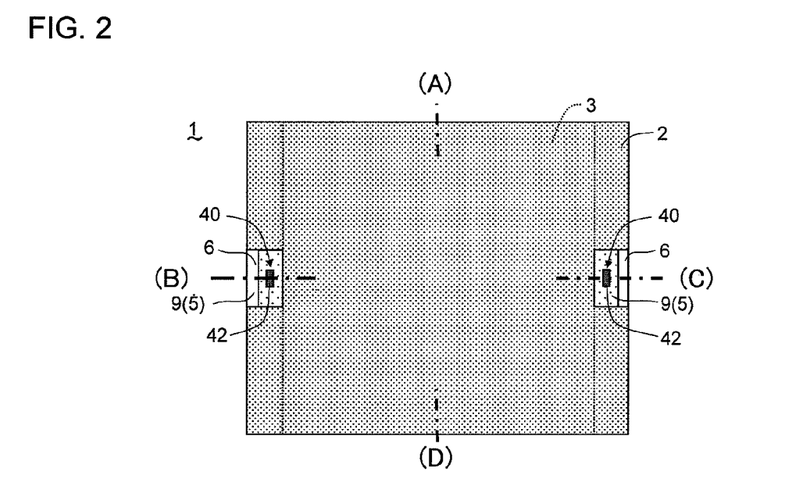
FIG. 2 is a back view of the organic EL device.
Figure 3:
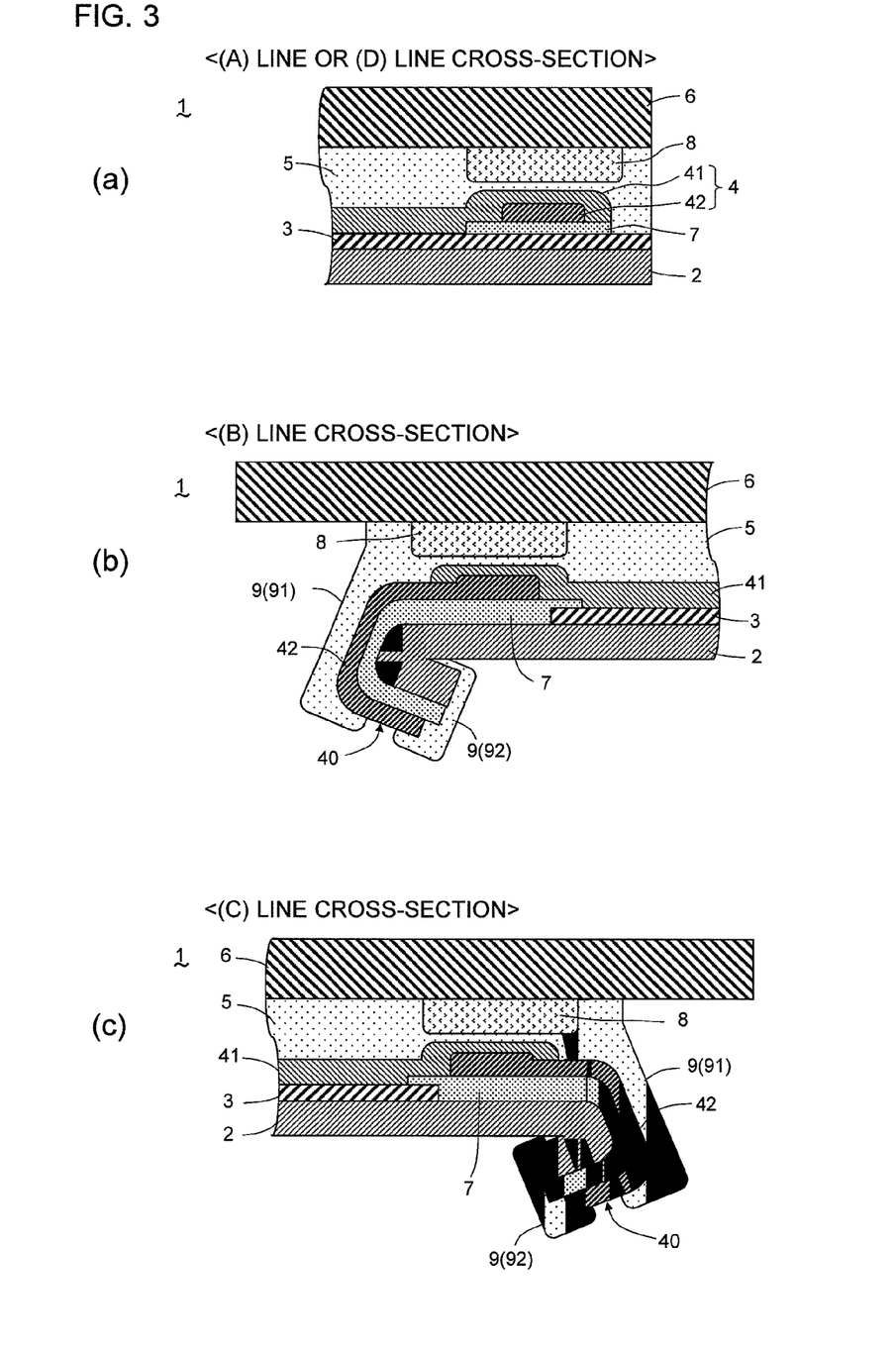
FIG. 3(a) is a side cross-sectional view taken along an (A) line or a (D) line in FIG. 2.
FIG. 3(b) is a side cross-sectional view taken along a (B) line in FIG. 2.
FIG. 3(c) is a side cross-sectional view taken along a (C) line in FIG. 2.
Figure 4:
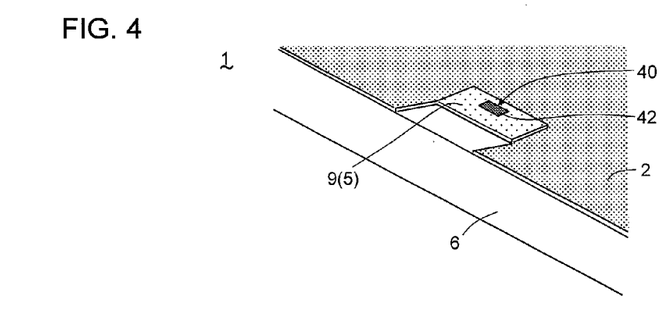
FIG. 4 is a perspective view of an electrode taking-out portion of the organic EL device.

In the region where the organic layer 3 is not formed, namely, in the portions indicated by the (B) line and the (C) line in FIG. 2 in the present embodiment, a portion of the auxiliary electrode portion 42 is provided on the first substrate 2 through the insulating layer 7 so as to extend to the outer peripheral side (see FIG. 1). As shown in FIGS. 3(b) and 3(c), the extended auxiliary electrode portion 42 is folded back together with portions of the insulating layer 7 and the first substrate 2 to a side opposite to the second substrate 6, to constitute an electrode taking-out portion 40. It is noted that in the present embodiment, an example is shown in which the electrode taking-out portion 40 is formed at one location in each of two opposing sides, but the electrode taking-out portion 40 may be provided at one location in either one of two opposing sides or may be provided at two or more locations in each of two opposing sides. The electrode taking-out portion 40 excluding a portion of the auxiliary electrode portion 42 is sealed by a sealing member 9, and the non-sealed portion is exposed on the back side of the first substrate 2 as shown in FIG. 4. The exposed portion of the auxiliary electrode portion 42 is electrically connected to an external power supply terminal or the like. It is noted that a formation procedure of the electrode taking-out portion 40 will be described later.

As the first substrate 2, a sheet member composed of a metal such as aluminum, copper, stainless, nickel, tin, lead, gold, silver, iron, or titanium, an alloy, or the like is used. The sheet member preferably has flexibility to such an extent that the member can be wound in a roll shape. In order to suppress short-circuiting of the element, the surface of the sheet member needs to have smoothness, and its surface roughness is preferably not greater than 100 nm in Ra and further preferably not greater than 10 nm in Ra.

In addition, the first substrate 2 is preferably composed of a metal material having barrier properties to moisture, gas, and the like. By so doing, deterioration of the organic layer 3 by moisture, gas, and the like can be suppressed. Moreover, since the first substrate 2 serves as a cathode for supplying electrons to the organic layer 3, the first substrate 2 is preferably composed of an electrode material such as a metal, an alloy, or an electrically-conductive compound having a low work function, or a mixture thereof.

In addition, for the first substrate 2, a metal such as aluminum or silver or a compound containing these metals can be used, or one formed to have a lamination structure or the like by combining aluminum and another electrode material may be used. Examples of such a combination of electrode materials include a laminate of an alkali metal and aluminum, a laminate of an alkali metal and silver, a laminate of aluminum and a halide of an alkali metal, a laminate of aluminum and an oxide of an alkali metal, a laminate of aluminum and an alkaline earth metal or a rare earth metal, and alloys of these metal species and other metals. Specific examples thereof include a laminate of aluminum and sodium, a sodium-potassium alloy, lithium, magnesium, or the like, a magnesium-silver mixture, a magnesium-indium mixture, an aluminum-lithium alloy, lithium fluoride (LiF)/an aluminum mixture/laminate, and aluminum/an aluminum oxide ($Al_2O_3$) mixture.

For the electron injection layer 31 constituting the organic layer 3, the same material as the material constituting the first substrate 2, metal oxides such as titanium oxide and zinc oxide, and organic semiconductor materials mixed with a dopant which prompts electron injection, including the above materials, are used. In addition, for the light emitting layer 32, any material known as a light emitting material of an organic EL element is used. Examples of such a light emitting material include anthracene, naphthalene, pyrene, tetracene, coronene, perylene, phthaloperylene, naphthaloperylene, diphenylbutadiene, tetraphenylbutadiene, coumarin, oxadiazole, bisbenzoxazoline, bisstyryl, cyclopentadiene, quinoline metal complex, tris(8-hydroxyquinolinate)aluminum complex, tris(4-methyl-8-quinolinate)aluminum complex, tris(5-phenyl-8-quinolinate)aluminum complex, aminoquinoline metal complex, benzoquinoline metal complex, tri-(p-terphenyl-4-yl)amine, pyrane, quinacridone, rubrene, derivatives thereof, a 1-aryl-2,5-di(2-thienyl)pyrrole derivative, a distyrylbenzene derivative, a styrylarylene derivative, a styrylamine derivative, and compounds or polymers having groups composed of these light emitting compounds in part of the molecules. Furthermore, in addition to the compounds derived from fluorescent dyes typified by the above compounds, so-called phosphorescence emitting materials, e.g., light emitting materials such as an Os complex, an Os complex, a Pt complex, and a europium complex, or compounds or polymers having these materials within the molecules can also be suitably used. Moreover, the light emitting layer 32 composed of these materials may be formed by a dry process such as deposition or transfer, or may be formed by application such as spin coating, spray coating, die coating, or gravure printing.

The material of the hole transport layer 33 can be selected from, for example, the group of compounds having hole transport capability. Examples of such a type of compounds can include triarylamine compounds typified by 4,4'-bis[N-(naphthyl)-N-phenyl-amino]biphenyl (α-NPD), N,N'-bis(3-methylphenyl)-(1,1'-biphenyl)-4,4'-diamine (TPD), 2-TNATA, 4,4',4"-tris(N-(3-methylphenyl)N-phenylamino)triphenylamine (MTDATA), 4,4'-N,N'-dicarbazolebiphenyl (CBP), spiro-NPD, spiro-TPD, spiro-TAD, and TNB, amine compounds containing a carbazole group, and amine compounds containing a fluorene derivative. In addition, any generally-known hole transport material can be used. Examples of the material of the hole injection layer 34 include low-molecular-weight organic compounds such as copper phthalocyanine (CuPc), and organic materials including thiophene triphenyl methane, hydrazoline, arylamine, hydrazine, stilbene, and triphenylamine. Specific examples thereof include aromatic amine derivatives such as polyvinyl carbazole (PVCz), polyethylenedioxythiophene:polystyrenesulfonate (PEDOT:PSS), and TPD, and the above materials may be used solely or two or more of them may be used in combination.

For the main electrode portion 41 of the electrode layer 4, any material known as an anode material of an organic EL element can be used. Examples of the anode material include nanowires of metals such as silver, indium tin oxide (ITO), indium zinc oxide (IZO), tin oxide, and gold, nanoparticles including nanodots, electrically-conductive polymers, electrically-conductive organic materials, dopant- (donor- or acceptor-) containing organic layers, and mixtures of a conductor and an electrically-conductive organic material (including a polymer), but the anode material only has to have electrical conductivity and translucency and is not limited to them. Furthermore, in addition to the electrically-conductive material, a binder may be included. Examples of the binder include acrylic resin, polyethylene, polypropylene, polyethylene terephthalate, polymethyl methacrylate, polystyrene, polyether sulfone, polyarylate, polycarbonate resin, polyurethane, polyacrylonitrile, polyvinyl acetal, polyamide, polyimide, diacrylphthalate resin, cellulose resin, polyvinyl chloride, polyvinylidene chloride, polyvinyl acetate, other thermoplastic resin, and copolymers of two or more of the monomers constituting these resins.

Figure 5:
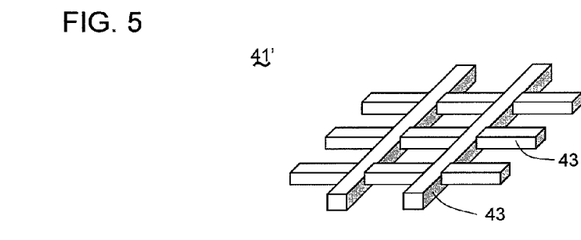
FIG. 5 is a perspective view showing a configuration example of a grid electrode used as an electrode layer of the organic EL device.

In addition, the main electrode portion 41 may be composed of a so-called grid electrode 41' in which low-resistance thin wires 43 are arranged in a lattice manner as shown in FIG. 5, in a stripe manner, or in a honeycomb manner. The diameter of each thin wire 43 is preferably not greater than 100 μm, in order that it is unlikely to reduce the translucency of the main electrode portion 41. Moreover, when the thin wires 43 are arranged in a lattice manner as shown, the interval between each thin wire 43 is set so as to be as large as possible as long as the electrical conductivity can be maintained, and is preferably set such that the aperture ratio is not less than 90%. Examples of the material of the thin wires 43 include various metals such as silver, aluminum, copper, nickel, tin, lead, gold, and titanium, alloys thereof, and electrically-conductive materials such as carbon. The grid electrode 41' is formed by patterning on the organic layer 3 by screen printing, gravure coating, die coating, or the like with a paste containing the above metal or electrically-conductive material. For the grid electrode 41', film formation by application is easily performed and is effective for efficiently manufacturing the organic EL device 1. It is noted that these materials and the forming methods are not particularly limited as long as wettability to the organic layer 3 and damage to the organic layer 3 are not caused.

The auxiliary electrode portion 42 is arranged in a frame shape so as to surround the periphery of the organic layer 3, the portion thereof is provided so as to extend to the outer peripheral side of a certain region of the organic layer 3 as described above, and this extended portion constitutes the electrode taking-out portion 40. The auxiliary electrode portion 42 is formed by patterning on the insulating layer 7 so as to have the above-described shape. At that time, an end portion of the folded-back auxiliary electrode portion 42 is formed so as to be located inward of the insulating layer 7 such that the end portion of the auxiliary electrode portion 42 is not short-circuited with the first substrate 2. In other words, in the organic EL device 1, the first substrate 2, which serves as a cathode, is structurally close to the auxiliary electrode portion 42, which serves as a portion of an anode. However, since the auxiliary electrode portion 42 is configured as described above, slight damage of the end portion of the insulating layer 7 does not lead to contact of the auxiliary electrode portion 42 with the first substrate 2 to cause short-circuiting, and thus the reliability of the device can be improved. It is noted that when a high-transparent material is used for the main electrode portion 41 facing the light emitting layer 32 and a high-electrical-conductivity material is used for the surrounding auxiliary electrode portion 42, the translucency of the entire electrode layer 4 (anode) is increased and the electrical conductivity thereof also can be increased. As the material of the auxiliary electrode portion 42, various metals used for general wires and electrodes are used, and the material of the auxiliary electrode portion 42 is not particularly limited as long as it has favorable electrical conductivity to the main electrode portion 41. In addition, unlike the main electrode portion 41, the material of the auxiliary electrode portion 42 may not have translucency.

The adhesive layer 5 is a paste-like or sheet-like member which is composed of a transparent resin material having excellent adhesiveness to the second substrate 6 and the electrode layer 4 and allowing light emitted from the light emitting layer 32 to pass therethrough and which is arranged so as to cover the peripheries of the organic layer 3 and the electrode layer 4. Examples of the material of the adhesive layer 5 include silicone resin, fluorine resin, acrylic resin, polyethylene, polypropylene, polyethylene terephthalate, polymethyl methacrylate, polystyrene, and polyvinyl acetate.

The second substrate 6 is a transparent plate-like member formed in the same shape as that of the first substrate 2, and a member having a uniform thickness and surface smoothness is used. As the material of the second substrate 6, for example, translucent glass such as soda lime glass or alkali-free glass, a translucent resin material, or the like is used.

The insulating layer 7 is formed by patterning in a shape substantially similar to that of the auxiliary electrode portion 42, so as to be wider than the auxiliary electrode portion 42. The insulating layer 7 is arranged such that the inner periphery thereof covers the outer periphery of the organic layer 3, and ensures insulation between the auxiliary electrode portion 42 and the organic layer 3 which are provided on the insulating layer 7. The insulating layer 7 is formed by a wet process using, as the material of the insulating layer 7, a thermosetting resin such as thermosetting polyimide resin or epoxy resin or a thermoplastic resin such as polyethylene or polypropylene, or by a dry process such as sputtering using, as the material of the insulating layer 7, an oxide or a nitride such as silicon oxide or silicon nitride. It is noted that in either process, patterning is required, and in particular, as the wet process, a method such as screen printing, die coating, spray coating, or gravure coating can be preferably used to form the insulating layer 7.

The moisture absorbent layer 8 is formed by patterning from a resin material containing a drying agent in such a frame shape that the region where the organic layer 3 is formed is opened. When the moisture absorbent layer 8 is provided, a slight amount of moisture entering the adhesive layer 5 is blocked. Thus, deterioration of the organic layer 3 can be effectively suppressed. As the material of the moisture absorbent layer 8, for example, a material, in which a drying agent such as calcium oxide, barium oxide, sodium oxide, potassium oxide, sodium sulfate, calcium sulfate, magnesium sulfate, calcium chloride, magnesium chloride, copper chloride, or magnesium oxide is added to a photo-curable adhesive resin such as epoxy resin, acrylic resin, or silicone resin can be used. It is noted that the moisture absorbent layer 8 is preferably previously provided on the surface of the second substrate 6 which surface faces the electrode layer 4 before the second substrate 6 and the electrode layer 4 are joined.

The sealing member 9 includes a base-side sealing portion 91 which seals a region from the folded-back position of the electrode taking-out portion 40 to the exposed position of the auxiliary electrode portion 42, and an end sealing portion 92 which seals the end portions of the auxiliary electrode portion 42, the insulating layer 7, and the first substrate 2 in the electrode taking-out portion 40 (see FIG. 3(b)). The base-side sealing portion 91 is an extended portion of the adhesive layer 5 which joins the electrode layer 4 and the second substrate 6. In addition, the end sealing portion 92 serves not only to seal the above end portions but also to adhere the end portions to the first substrate 2. Since the electrode taking-out portion 40 excluding a portion of the auxiliary electrode portion 42 is sealed by the sealing member 9 as described above, moisture or the like is unlikely to enter the device and deterioration of the organic layer 3 can be suppressed. It is noted that as described later, the sealing member 9 may be a member separate from the adhesive layer 5. As the material of the sealing member 9, the same material as that of the adhesive layer 5 is used. It is noted that the sealing member 9 is located outward of the region where the organic layer 3 is formed, or on the back side of the first substrate 2, and thus a non-translucent material may be used therefor unlike the adhesive layer 5.

Figure 6:
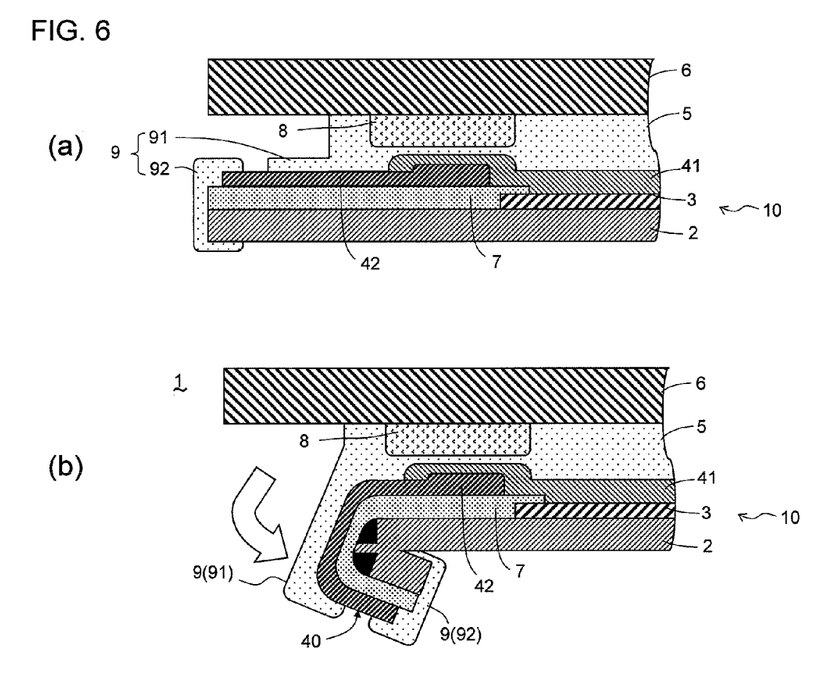
FIGS. 6(a) and 6(b) are side cross-sectional views showing a production procedure of the electrode taking-out portion of the organic EL device.
Figure 7:
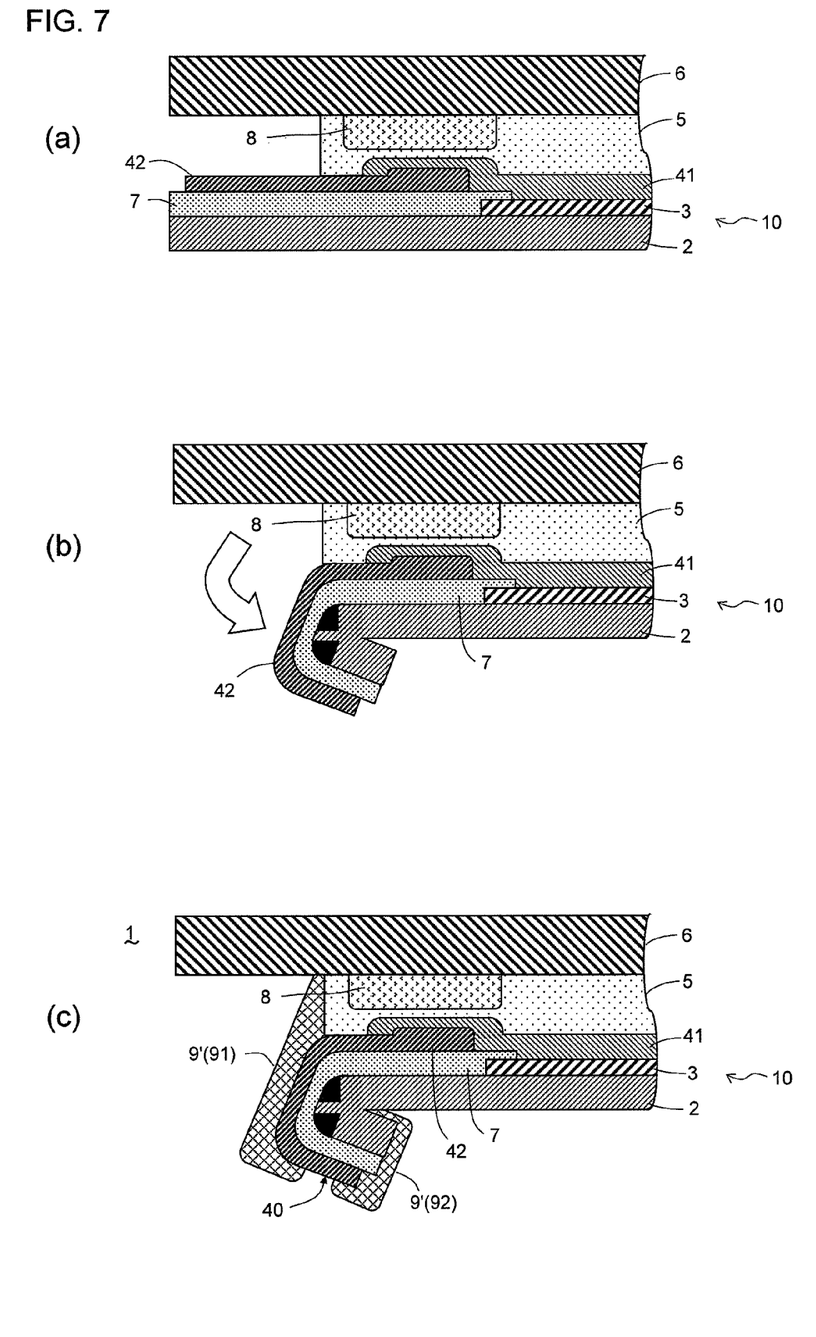
FIGS. 7(a) to 7(c) are side cross-sectional views showing another production procedure of the electrode taking-out portion of the organic EL device.

Next, the formation procedure of the electrode taking-out portion 40 will be described with reference to FIGS. 6(a) and 6(b). As shown in FIG. 6(a), the organic layer 3 is laminated on the first substrate 2, and the insulating layer 7, the auxiliary electrode portion 42, and the main electrode portion 41 are formed by patterning in predetermined shapes, respectively, on the organic layer 3. Hereinafter, one in which the organic layer 3, the insulating layer 7, and the electrode layer 4 (the auxiliary electrode portion 42 and the main electrode portion 41) are formed on the first substrate 2 is referred to as a light emitting sheet 10. Meanwhile, the moisture absorbent layer 8 is provided at a predetermined position on the surface of the second substrate 6 which surface faces the electrode layer 4. Then, the adhesive layer 5 is arranged so as to cover the entireties of the auxiliary electrode portion 42 and the main electrode portion 41 excluding the folded-back end portions of the insulating layer 7, the auxiliary electrode portion 42, and the like, and the second substrate 6 is joined to the light emitting sheet 10 by the adhesive layer 5. In addition, the end sealing portion 92 is provided at the end portions of the insulating layer 7, the extended auxiliary electrode portion 42, and the like, and as shown in FIG. 6(b), the end portions of the insulating layer 7, the extended auxiliary electrode portion 42, and the like are folded back to the side opposite to the second substrate 6 and fixed to the back surface of the second substrate 6 (SIC: correctly it should be first substrate 2) by the end sealing portion 92. It is noted that when the adhesive layer 5 which partially covers the base end side of the extended auxiliary electrode portion 42 is used as the base-side sealing portion 91, the process of applying the sealing member 9 can be partially simplified. Through such a procedure, the organic EL device 1 including the electrode taking-out portion 40 is manufactured.

In other words, in the organic EL device 1, since the portion of the auxiliary electrode portion 42 is provided so as to extend in the region where the organic layer 3 is not formed, the electrode taking-out portion 40 can easily be formed by folding back the end portions of the insulating layer 7, the auxiliary electrode portion 42, and the like. Thus, the organic EL device 1 can be efficiently manufactured. In addition, materials having flexibility can be used as the materials constituting the light emitting sheet 10 such as the first substrate 2, the organic layer 3, the insulating layer 7, the auxiliary electrode portion 42, and the main electrode portion 41, and the second substrate 6 may be flexible or hard. In other words, when the light emitting sheet 10 produced so as to have flexibility is joined to the flexible or hard second substrate 6 as appropriate, both flexible type and hard type organic EL devices 1 can be manufactured by using the light emitting sheet 10 of the same configuration.

In addition, in the organic EL device 1 according to the present embodiment, a band-like sheet member fed in a state of being wound in a roll shape can also be used as the first substrate 2. In this case, the organic layer 3 is continuously formed on a surface of the band-like first substrate 2 by a slit coater or the like. Furthermore, the insulating layer 7, the auxiliary electrode portion 42, and the main electrode portion 41 are formed by screen printing or the like at regular intervals. After the formation, the first substrate 2 is wound in a roll shape again and collected. By so doing, a light emitting sheet roll (not shown) in which a plurality of light emitting sheets 10 are continuously formed can be produced by a so-called roll-to-roll process. Then, the light emitting sheet roll is adhered to the long second substrate 6 which is formed with the same width and the same length as the band-like first substrate 2, they are cut at regular intervals, and the electrode taking-out portions 40 are formed by folding back as described above. By so doing, many organic EL devices 1 as shown in FIG. 2 can be manufactured in a short time. In particular, in recent years, the organic layer 3 tends to be multilayered, for example, the light emitting layer 32 are formed as multiple layers, and electric charge adjusting layers are arranged therebetween. The formation of the organic layer 3 by the roll-to-roll process allows many organic layers composed of multiple layers as described above to be simultaneously produced.

Next, other formation procedures of the electrode taking-out portion 40 will be described with reference to FIGS. 7(a) to 7(c) and FIGS. 8(a) to 8(d). In the procedure shown in FIGS. 7(a) to 7(c), first, the adhesive layer 5 is arranged so as to not extend in a portion of the electrode taking-out portion 40, and is caused to join the light emitting sheet 10 and the second substrate 6 (FIG. 7(a)). Subsequently, a portion corresponding to the electrode taking-out portion 40 is folded back (FIG. 7(b)), and then the electrode taking-out portion 40 (SIC: correctly it should be auxiliary electrode portion 42) is sealed and fixed by a sealing member 9' which is a member separate from the adhesive layer 5 (FIG. 7(c)). According to this procedure, after the light emitting sheet 10 and the second substrate 6 are sufficiently adhered to each other, the portion corresponding to the electrode taking-out portion 40 can be folded back. Thus, a gap is unlikely to be formed between the adhesive layer 5 and the auxiliary electrode portion 42 by the folding-back operation, and entry of moisture or the like into the adhesive layer 5 can be suppressed.

Figure 8:
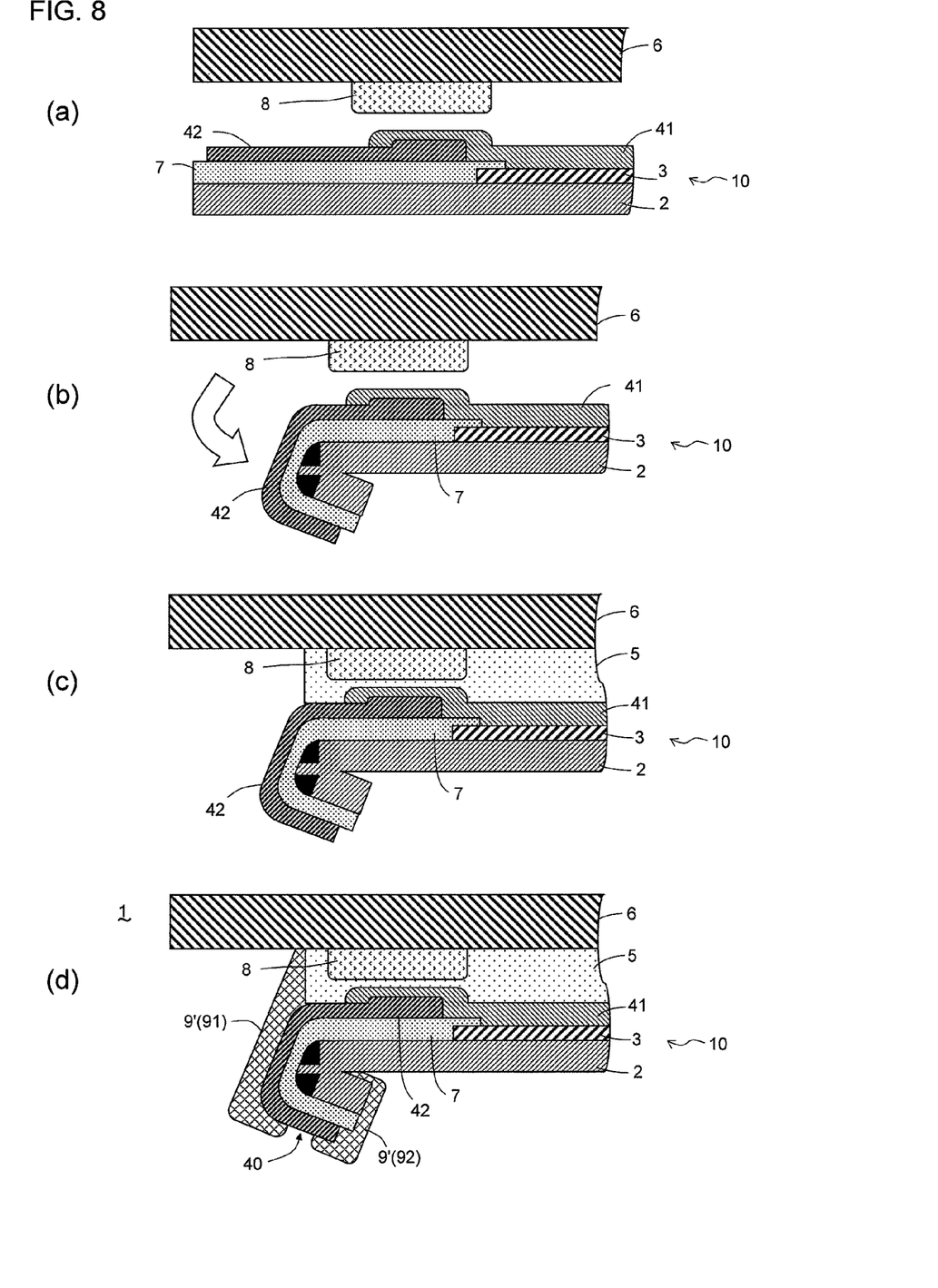
FIGS. 8(a) to 8(d) are side cross-sectional views showing another production procedure of the electrode taking-out portion of the organic EL device.

In addition, in the procedure shown in FIGS. 8(a) to 8(d), the portion corresponding to the electrode taking-out portion 40 is folded back prior to joining the light emitting sheet 10 and the second substrate 6 (FIGS. 8(a) and 8(b)), and then the light emitting sheet 10 and the second substrate 6 are joined to each other (FIGS. 8(c) and 8(d)). In this procedure as well, similarly to the procedure shown in FIGS. 7(a) to 7(c), a gap is unlikely to be formed between the adhesive layer 5 and the auxiliary electrode portion 42 by the folding-back operation.

It is noted that the present invention is not limited to the embodiment described above, and various modifications can be made as long as: the region where the organic layer is not formed is present in a region of the peripheral portion of the substrate; and a portion of the electrode layer provided in this region is folded back and hence exposed as an electrode taking-out portion.

The present application is based on Japanese Patent Application No. 2011-035220, and the content thereof is incorporated herein by reference to the specification and the drawings of the above patent application.

DESCRIPTION OF THE REFERENCE CHARACTERS 1 organic EL device
2 first substrate (cathode)
3 organic layer
4 electrode layer (anode)
40 electrode taking-out portion
41 main electrode portion
41' grid electrode
42 auxiliary electrode portion
43 thin wire
5 adhesive layer
6 second substrate
7 insulating layer
8 moisture absorbent layer
9 sealing member
9' sealing member

The invention claimed is:

1. An organic EL device comprising:
a first substrate having electrical conductivity;
an organic layer formed on the first substrate;
an electrode layer formed on the organic layer; and
a second substrate joined to the electrode layer by an adhesive layer, wherein
in a region of a peripheral portion of the first substrate, the organic layer is not formed, and a portion of the electrode layer is provided on the first substrate through an insulating layer so as to extend to an outer peripheral side of a region where the organic layer is present, and
the extended electrode layer is folded back together with the insulating layer to a side opposite to the second substrate, to constitute an electrode taking-out portion.

2. The organic EL device according to claim 1, wherein the electrode layer in the electrode taking-out portion is formed so as to be located inward of the insulating layer such that an end portion of the electrode layer is not short-circuited with the first substrate.

3. The organic EL device according to claim 1, wherein a moisture absorbent layer is provided on a surface of the second substrate which surface faces the electrode layer, such that the moisture absorbent layer does not overlap the region where the organic layer is formed and is not in contact with the electrode layer.

4. The organic EL device according to claim 1, wherein the electrode taking-out portion excluding a portion of the electrode layer is sealed by a sealing member.

5. The organic EL device according to claim 4, wherein a portion of the sealing member is an extended portion of the adhesive layer.

6. The organic EL device according to claim 4, wherein the sealing member is a member separate from the adhesive layer.

7. The organic EL device according to claim 1, wherein the electrode layer comprises a main electrode portion which is in contact with the organic layer and an auxiliary electrode portion which is in contact with the main electrode portion and is insulated from the organic layer.

8. The organic EL device according to claim 7, wherein the electrode layer in the electrode taking-out portion is a portion of the auxiliary electrode portion.

9. The organic EL device according to claim 7, wherein the main electrode portion is composed of a grid electrode in which low-resistance thin wires are arranged in a lattice manner, in a stripe manner, or in a honeycomb manner.

10. The organic EL device according to claim 1, wherein the first substrate is composed of a metal material having barrier properties.

* * * * *